United States Patent [19]

Kurosaki et al.

[11] Patent Number: 4,623,992
[45] Date of Patent: Nov. 18, 1986

[54] OPERATING PANEL FOR ELECTRONIC AUDIO EQUIPMENT

[75] Inventors: Masanori Kurosaki; Yoshio Aoyagi; Yoshiharu Ueki; Yukihiro Kaneko; Minoru Motohashi; Shozaburo Sakaguchi; Manabu Sawaki, all of Saitama, Japan

[73] Assignee: Pioneer Electronic Corporation, Tokyo, Japan

[21] Appl. No.: 558,742

[22] Filed: Dec. 6, 1983

[30] Foreign Application Priority Data

Dec. 6, 1982 [JP] Japan .......................... 57-184513[U]
Jan. 26, 1983 [JP] Japan .................... 58-9943

[51] Int. Cl.$^4$ .......................... H04B 1/20; H04B 1/08
[52] U.S. Cl. ......................................... 369/6; 369/12; 360/137; 361/331; 455/347
[58] Field of Search ...................... 369/6, 12; 360/137; 455/347, 349; 361/331, 358

[56] References Cited

U.S. PATENT DOCUMENTS

| 4,120,037 | 10/1978 | Sato ...................................... 369/6 X |
| 4,249,744 | 2/1981 | Bromley .......................... 273/85 G |
| 4,388,712 | 6/1983 | Timm ................................ 369/12 X |
| 4,520,800 | 6/1985 | Kowalski ............................. 128/72 |

Primary Examiner—Robert L. Richardson
Attorney, Agent, or Firm—Sughrue, Mion, Zinn, Macpeak & Seas

[57] ABSTRACT

In a cassette tape deck having a cover panel for covering an opening into which a tape cassette may be inserted, a keyboard section with dials for operating the tape deck and a display section with display elements for displaying operating conditions of the tape deck are provided on both front and rear surfaces of the cover panel of the tape deck.

8 Claims, 12 Drawing Figures

OPERATING PANEL FOR ELECTRONIC AUDIO EQUIPMENT

BACKGROUND OF THE INVENTION

The present invention relates to an operating panel for electronic equipment, and more particularly to an operating panel for mobile electronic equipment.

In a cassette tape deck, which is only one component of a car-stereo set, the area available as an operating surface, that is, the area available for mounting the operating controls, indicator lights, etc., is limited. In one typical example, these must be provided within an area of 8×5 cm not only an opening for loading a cassette tape but also a keyboard section for controlling the operations of the cassette tape deck and a display section for displaying the operating conditions of the tape deck. The car stereo set should be disposed near the driver's seat to facilitate the driver operating it. The only places which meet this requirement are either on the dash board or console. Accordingly, the size of the car stereo set is restricted, so that the area of the front surface of the tape deck available as an operating surface or panel is limited. If all possible switching and displaying elements were provided on the front surface of the tape deck, the surface would be so cluttered that misoperation wound be liable to occur. Therefore, it is necessary that elements which are not frequently used be omitted from the front panel.

SUMMARY OF THE INVENTION

In view of the foregoing, an object of the invention is to provide an operating panel on which necessary switching elements and display elements are provided without resulting in a highly cluttered panel.

A further object of the invention is to provide an operating panel on which switching elements and display elements for more than two electronic components (pieces of equipment) are provided.

These and other objects of the invention are met by providing various operating elements on a cover panel of a tape deck used to cover a cassette tape loading portion. In one embodiment, the elements are provided not only on the front surface of the cover panel, but also on the rear surface thereof.

DESCRIPTION OF THE PREFERRED EMBODIMENTS

Preferred embodiments according to the present invention will now be described with reference to the accompanying drawings.

Figure 1:
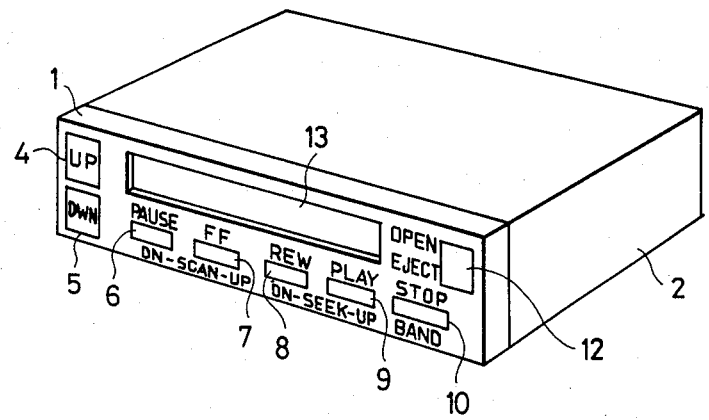
FIG. 1 is a perspective view showing a first embodiment of the device according to the invention.
Figure 2:
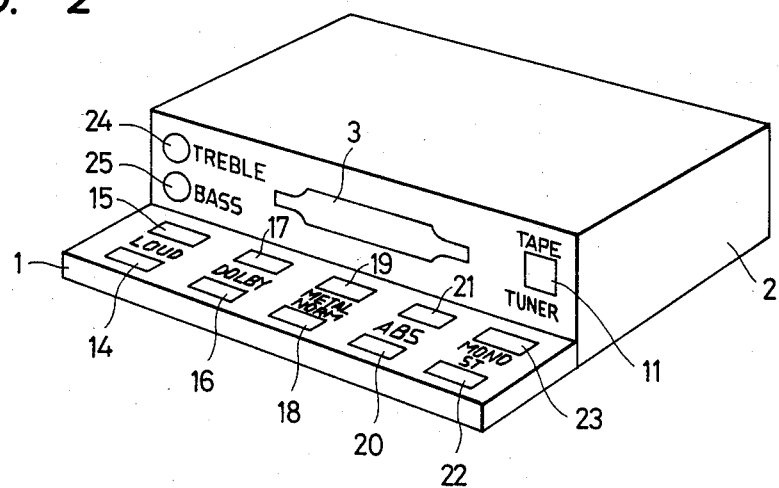
FIG. 2 is a perspective view showing an opened condition of a panel of the device shown in FIG. 1.

FIGS. 1 and 2 are perspective views of a cassette tape deck having a hinged cover panel which covers an opening for insertion of a cassette tape. In accordance with the invention, the surfaces of the cover panel are used as operating panels on which various switches are provided. FIG. 1 shows a closed state of the cover panel and FIG. 2 shows an opened state thereof.

On the front surface of the cover panel 1, electronic type volume control switches 4 and 5 are provided which, respectively, increase and decrease the volume when depressed. Also provided are various operating switches, such as PAUSE 6, FF (Fast Forward) 7, REW (Rewind) 8, PLAY 9 and STOP 10. It should be noted that these switches are used not only to operate the cassette tape deck but also to operate an AM/FM radio tuner. That is, the switches 6–10 are used for controlling the radio receiver when the radio receiver is in operation.

Specifically, as indicated below in more detail, the switches 6 and 7 are, respectively, used for decreasing and increasing the receiving frequency in the case of frequency scanning. The switches 8 and 9 are used for down and up directional seeking operations to seek a preset broadcasting station. The switch 10 is a band selection switch used for selection of a frequency band, e.g. between AM and FM. The switch 11, which is provided on the front surface of the tape deck body 2, is employed for selection between the tape deck and the tuner. On the front surface of the cover panel 1, an open-eject switch 12 and a display section 13 are further provided. The display section 13 uses, for example, a double-layer liquid crystal display (LCD) in which the first layer is used for the display of the tape deck operating conditions and the second layer for the display of the radio receiver operating conditions.

The rear surface of the cover panel 1 will next be described referring to FIG. 2. Reference numeral 14 designates a loudness switch, and 15, a display element comprising, for example, an LED (Light-Emitting Diode) to display the state of depression of the switch 14. Reference numeral 16 designates a Dolby TM switch used, for reduction of tape noise and 17, a display element thereof. Reference numeral 18 designates a metal/normal tape change-over switch, and 19, a display element thereof. Reference numeral 20 designates an ON/OFF switch used to select an auto blank skip (ABS) function, and 21, a display element thereof. Reference numeral 22 designates a monaural/stereo change-over switch; and 23, a display element thereof. On the left portion of the front surface of the tape deck body 2, treble and bass control knobs 24 and 25 are provided.

As is clear from the above, the switches and display elements which are provided on the rear surface of the cover panel 1, are not frequently used compared with those provided on the front surface of the cover panel 1.

In this fashion, the overall surfaces of the cover panel 1 are effectively utilized as panel surfaces.

Figure 3:
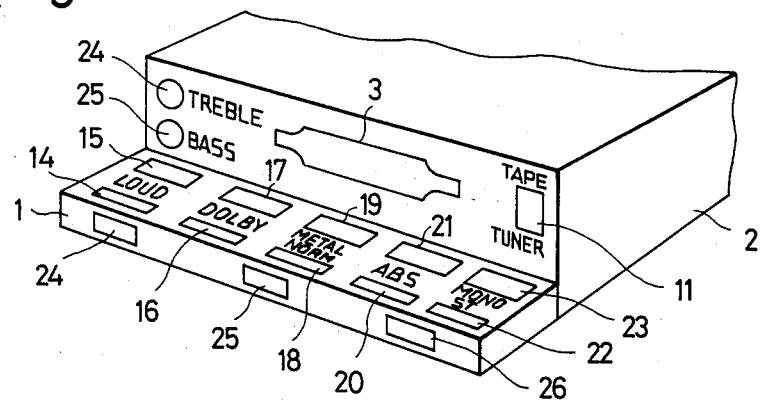
FIG. 3 is a perspective view showing a second embodiment of the device according to the invention.

FIG. 3 shows another embodiment of the invention, in which like reference numerals designate like elements or components to those shown in FIGS. 1 and 2. In the embodiment of FIG. 3, switch elements or display elements 24–26 are provided on the top surface of the cover panel 1. It would be apparent that further modification is possible to provide further elements on the side surfaces of the cover panel 1.

Figure 4:
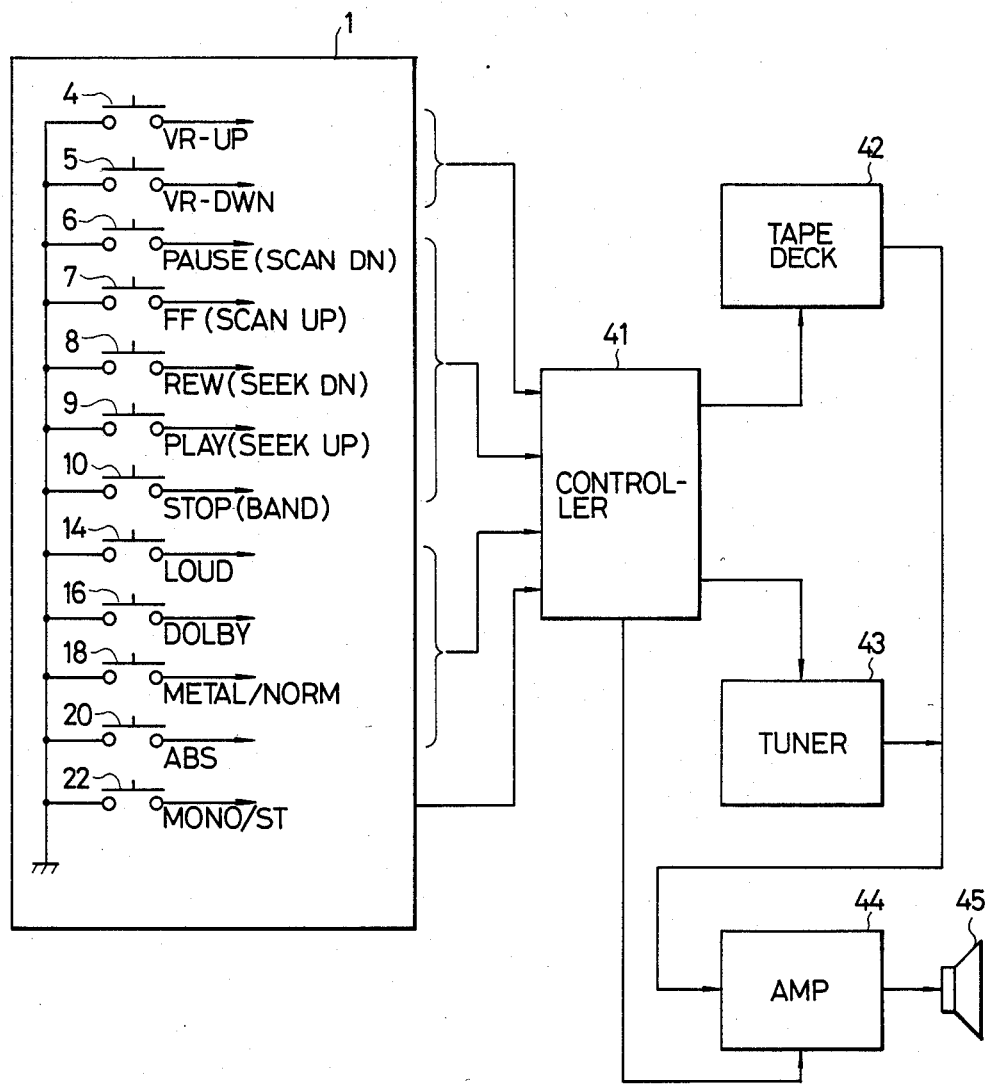
FIG. 4 is a block diagram showing electrical connections of various switching elements to electronic components.

FIG. 4 is a block diagram showing the electrical connections of the device shown in FIGS. 1 and 2, in which like reference numerals designate like elements or components to those shown in FIGS. 1 and 2. Various instruction signals supplied from the switches on the operation panel are applied to a controller 41, which in turn applies system instruction signals to a tape deck 42, the tuner 43 and a main amplifier 44 to implement various controls. Reference numeral 45 designates a loudspeaker. For the purpose of simplification, no display elements for displaying the ON states of the switches are shown in FIG. 4.

The switches and display elements provided on the operating panel are electrically connected to the controller 41 via flexible lines. In order to reduce the number of lines, the signals from the switches may be converted to a digital format to carry out serial data transmission. Wireless communication is also applicable, in which case the panel can be separated from the body of the tape deck. Optical communicating elements can be used for this purpose.

Figure 5:
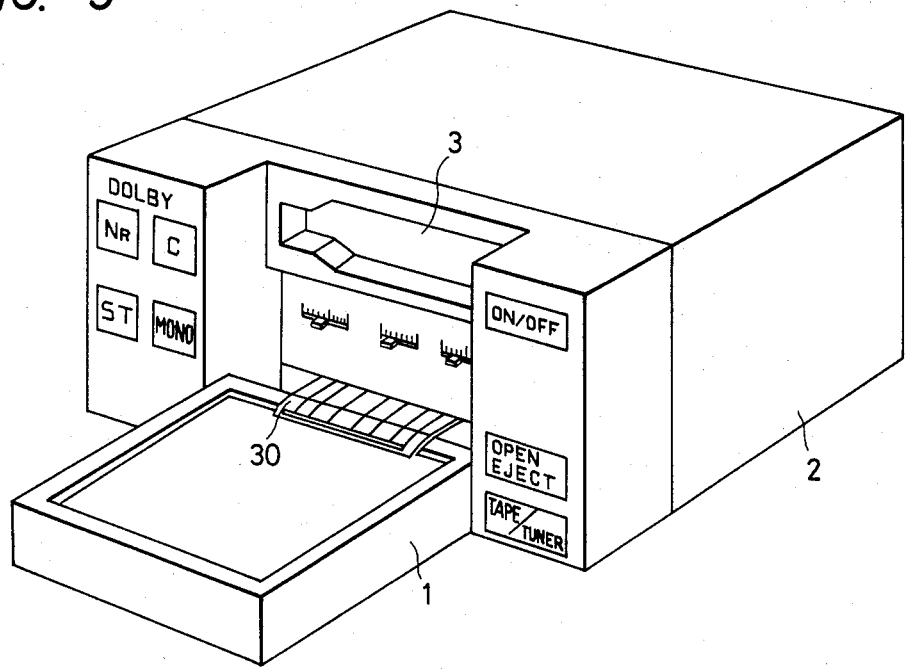
FIG. 5 is a perspective view showing a third embodiment of the device according to the invention.

Although one embodiment has been described in which the cover panel is provided to cover the entire front surface of the tape deck, a cover panel may be provided to cover only the central portion of the front surface of the tape deck as shown in FIG. 5. That is, the front portion of the tape deck can be concavely configured and the cover panel adapted to engage the concave portion thereof.

In both of the embodiments shown in FIGS. 1-3 and 5, flexible lines are used to electrically connect electronic circuits of the tape deck and the switches and display elements on the operating panel. If the connecting lines are exposed when the cover panel is in an open state, as shown in FIG. 5, then there is a danger that the lines 30 will be damaged or cut when the cover panel is closed. The lines 30 may be damaged or cut if some obstacle is present in the groove between the body of the tape deck 2 and the cover panel 1 when the cover panel is being closed. In such a case, the internal electronic circuits might be damaged or destroyed. In order to eliminate such a possibility, it is preferable that the connecting lines be protected by a protector, as will now be further described.

Figure 6:
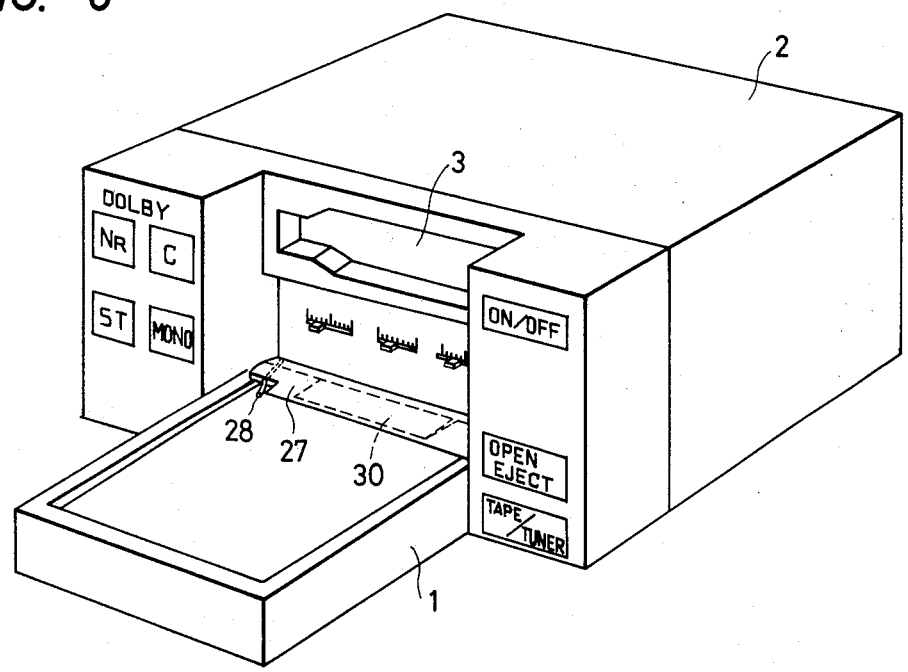
FIG. 6 is a perspective view showing a protector for protecting the electrical connections between the various switching elements and electronic components.

FIG. 6 shows an example of a suitable protector 27, which is provided along a hinged axis about which the cover panel is rotatable. The protector 27 serves not only to cover the connecting lines, but also to cover the groove between the body of the tape deck 2 and the cover panel 1.

Figure 7A:
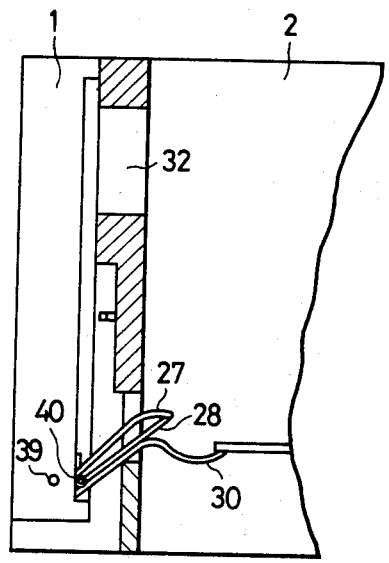
FIGS. 7A through 7C are cross-sectional views of the device shown in FIG. 6.
Figure 7B:
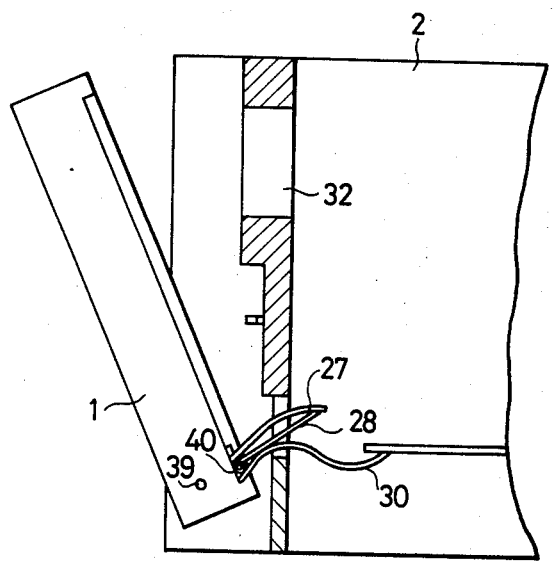
Figure 7C:
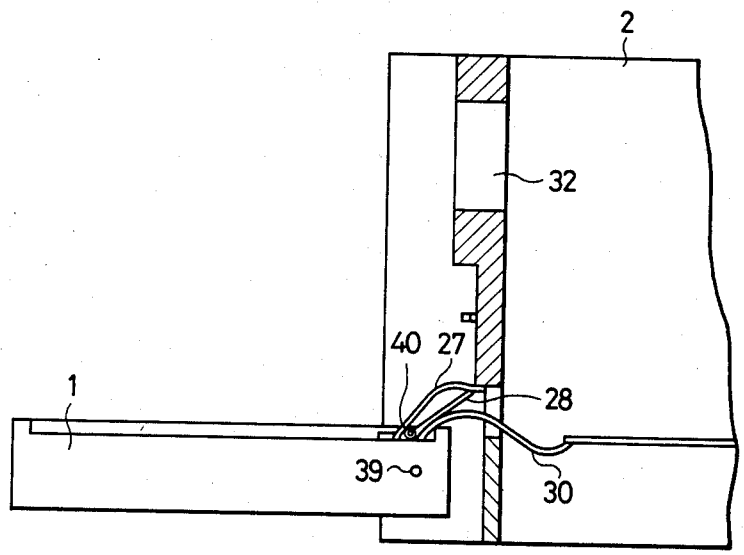

FIGS. 7A–7C are cross-sectional views of the device shown in FIG. 6. FIG. 7A shows the case where the cover panel 3 is closed; FIG. 6B shows the case where the cover panel 3 is opened half way; and FIG. 6C shows the case where the cover panel 3 is completely opened. Reference numeral 40 designates a shaft member provided in the cover panel 1 in the vicinity of and parallel to the rotational axis thereof. On both ends of the shaft member 40, first ends of elastic springs 28 are wound (see FIG. 6). Second ends of the elastic springs 28 abut edge portions of the rear surface of the protector 27.

With the structure described above, the cover panel 1 is prevented from being moved opened. However, the opening operation can be smoothly performed, since after the free end of the protector 27 abuts the wall portion of the tape deck body, a braking force is produced by the action of the springs 28.

Instead of employing the elastic springs 28, the protector 37 may be made of an elastic material, in which case the opening motion of the cover panel 1 will be damped due to the weight of the panel. Therefore, the opening motion can be smoothly performed due to the elastic force of the elastic material since the free end of the protector 27 abuts the wall portion of the tape deck body when the cover panel 1 is being opened. In the case of employing the spring 28, it is not necessary that the protector be made of an elastic material. Instead, flexible or bellows type members can be employed for the protector.

Data communication between a keyboard section (a group of switching elements) and the tape deck body and/or between a display section on the operating panel and the tape deck body will now be described.

Figure 8:
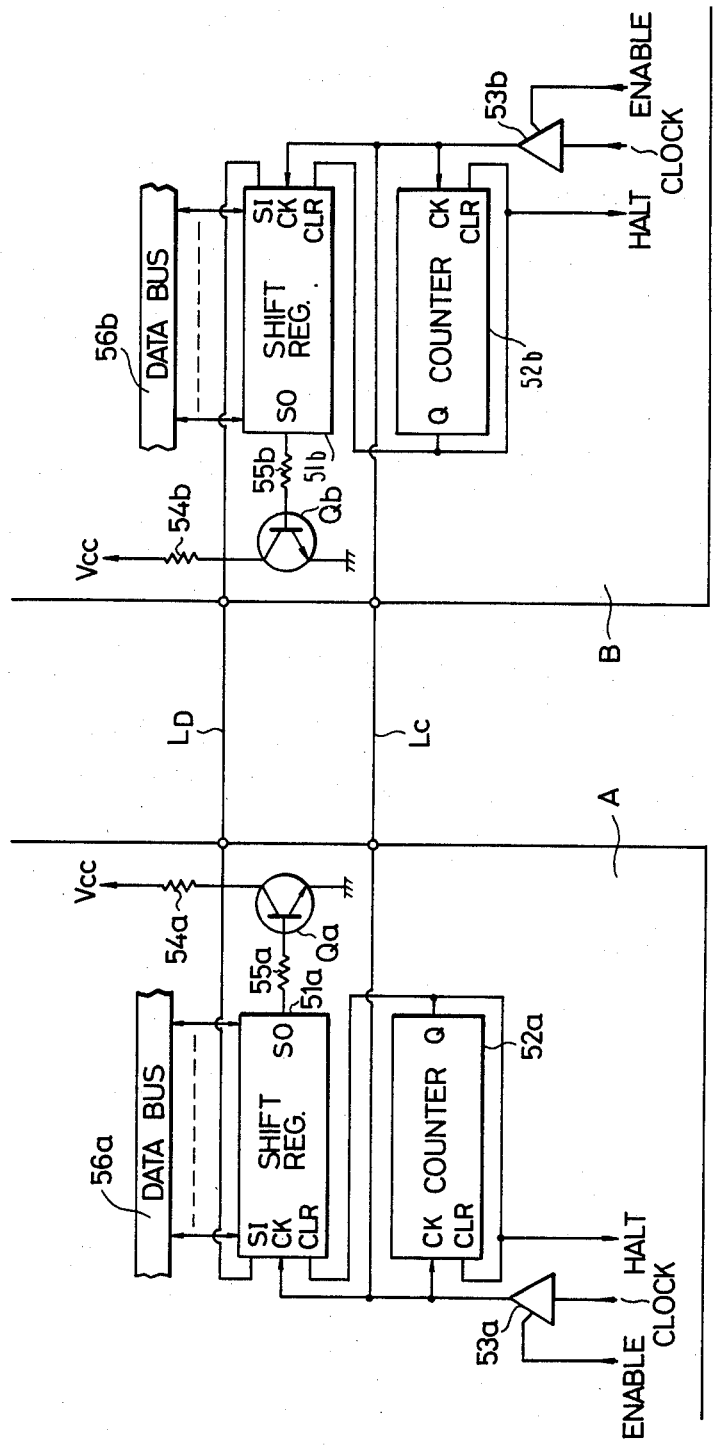
FIG. 8 is a block diagram showing an example of a serial data communication circuit used with the invention.

Referring to FIG. 8, there is shown a block diagram of an example of a serial data communication circuit. In this figure, reference numerals 51a and 51b designate shift registers provided in tne keyboard section (hereinafter referred to as "section A") and the electronic circuit of the tape deck (hereinafter referred to as "section B"), respectively. Output terminals SO of the shift registers 51a and 51b are connected, respectively, through resistors 55a and 55b to bases of transistors $Q_a$ and $Q_b$, which act as buffers. Input terminals SI of the shift registers 51a and 51b are connected to collectors of the transistors $Q_a$ and $Q_b$, respectively. Reference numerals 52a and 52b designate counters, each of which counts the number of clock pulses inputted to the clock input terminal CK, then outputs a signal through the output terminal upon counting a predetermined number of clock pulses from the output terminal Q, which is connected to a clear input terminal CLR of the associated shift register 51a or 51b. The contents of the shift registers 51a and 51b are cleared upon reception of the signals on their respective clear input terminals CLR. Reference numerals 53a and 53b designate tri-state buffers which are enabled by the application of ENABLE signals to thereby control the application of the clock pulses.

Reference numerals 54a and 54b are pull-up resistors which are connected between the respective collectors of the transistors $Q_a$ and $Q_b$ and a voltage source $V_{cc}$. In this arrangement, open-collector buffers are constituted by NPN transistors. It is possible to replace the NPN transistors with N-channel MOSFETs in an open-drain configuration. Reference numerals 56a and 56b designate data buses.

In operation, data to be transmitted is sent into the shift register 51a from the data bus 56a, and simultaneously the shift register 51b is reset. Next, the tri-state buffer 53a is enabled to permit the shift clocks to be fed to both the shift register 51a and the counter 52a, so that the content of the shift register 51a is shifted in a bit-by-bit fashion and the output of the shift register 51a is outputted through the transistor $Q_a$ to a data line $L_d$. The shift clocks are also fed through a clock line $L_c$ to both the shift register 51b and its associated counter 52b. The data from the shift register 51a is applied bit-by-bit into the shift register 51b. The shift register in turn outputs in a bit-by-bit fashion in accordance with the application of the shift clocks. However, since the content of the shift register 51b was initially cleared and all the latch segments are zeroes, the output of the shift register 51b is always maintained at a low level, thereby keeping the transistor $Q_b$ in the OFF state. Therefore, the output of the shift register 51b has no effect on the data line $L_d$.

When the entire content of the shift register 51a been outputted and a predetermined number of shift clocks have been applied to the shift register 51a, the counter 52a, which counts up the number of shift clocks applied to the shift register 51a, produces a halt signal from its output terminal Q to halt the data communication process. The halt signal is applied to the clear input terminal CLR of the shift register 51a to thereby reset the latter. In the section B, the counter 52b likewise counts the shift clock pulses fed from the section A and produces a halt signal from its output terminal Q. In response to the halt signal thus produced, the content of the shift register 51b is applied in parallel into the data bus 56b, and the content of the shift register 51b is cleared and the shaft register 51b is again placed in a ready condition to receive data from the section A.

Data communication from the section B to the section A is performed in a similar manner as from the section A to the section B as described above. In the case where data communication is performed among three sections or more, the only procedure to be taken is to connect the shift clock line of the section to be added to the data line, because the data receiving section does not affect the data line, as noted previously.

In the above example, the transistors $Q_a$ and $Q_b$ are NPN transistors, but it is possible to employ PNP transistors if all the segments of the shift registers 51a and 51b are set to high levels by the application of the reset signal thereto.

Figure 9:
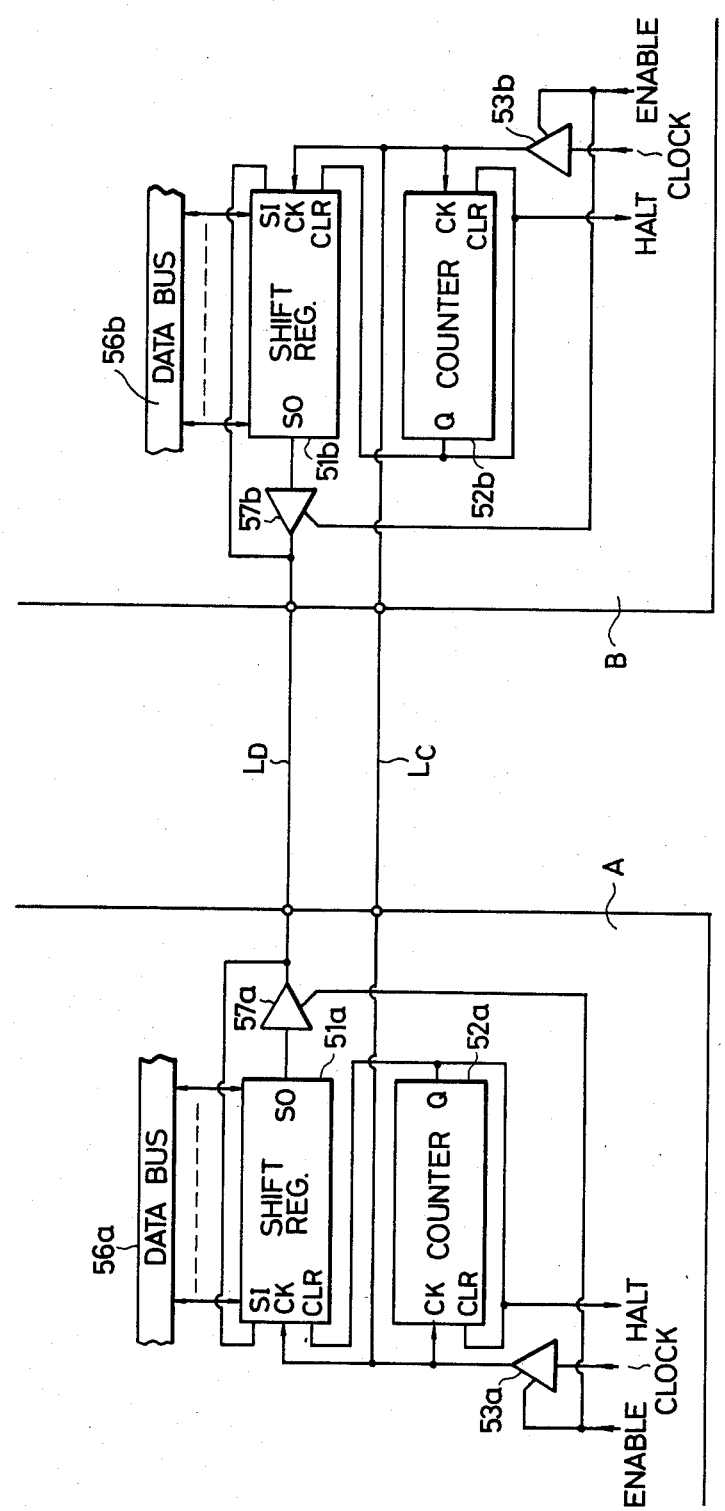
FIG. 9 is a block diagram showing another example of a serial data communication circuit used with the invention.

Further modification is possible in which the transistors $Q_a$ and $Q_b$ are replaced by tri-state buffers 57a and 57b which are enabled in synchronization with the tri-state buffers 53a and 53b as shown in FIG. 9. In this case, it is not necessary to reset the shift register 51a and 51b at the tie of commencement of data communications.

The data communication circuits shown and described with reference to FIGS. 8 and 9 can be utilized to implement data communication among the keyboard section X, display section Y and the tape deck Z by the electrical connections indicated in FIG. 10. The keyboard section X, display section Y and the tape deck Z each have their own interface circuit I, II and III, respectively, with each interface circuit including a shift register, a counter and a tri-state buffer. The keyboard section X, the display section Y and the tape deck Z are connected to their associated interface circuit with data buses $B_x$, $B_y$ and $B_z$, respectively, and the respective interface circuits I, II and III are mutually connected to one another by the data line and clock line.

Figure 10:
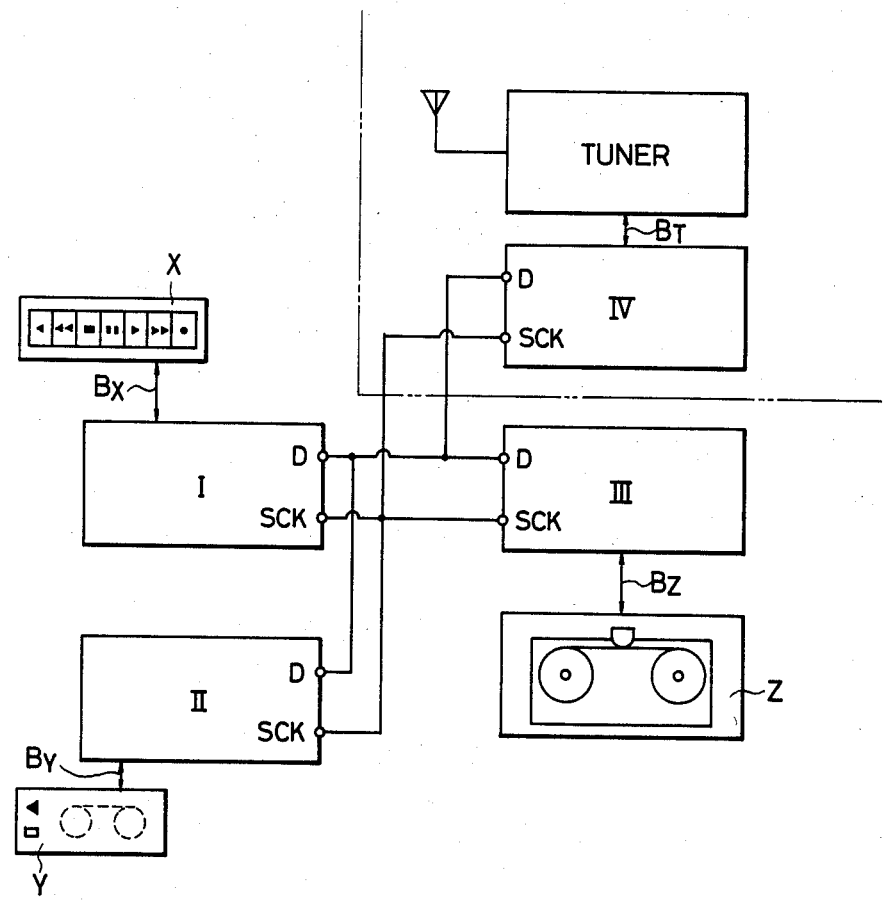
FIG. 10 is a block diagram showing electrical connections of switching elements and displaying elements to the electronic components.

The tuner T, surrounded by a double line in FIG. 10, can further be connected through its interface circuit IV to both the keyboard X and the display section Y in the same manner as described above. Even in such a case, the number of lines connecting the respective sections does not exceed two, and thus the desired reliability is attained.

What is claimed is:

1. In an operating panel for at least one electronic component, said electronic component having a hinged cover panel member covering one surface of said electronic component and having operating means operable by a user to control operation of said electronic component, the improvement wherein said operating means is provided on at least two surfaces of said cover panel member.

2. The operating panel as claimed in claim 1, wherein said operating means comprises switching elements and display elements for displaying ON-OFF conditions of said switching elements.

3. The operating panel as claimed in claim 1, further comprising an electrical connector for electrically connecting said operating means on said cover panel member to other portions of said at least one electronic component.

4. The operating panel as claimed in claim 3, wherein said electrical connector comprises at least one flexible connecting line.

5. The operating panel as claimed in claim 3, further comprising a protector member for protecting said electrical connector.

6. The operating panel as claimed in claim 4, further comprising a protector member for protecting said at least one flexible connecting line.

7. The operating panel as claimed in claim 1, wherein one of said at least one electronic component comprises a cassette tape deck.

8. The operating panel as claimed in claim 7, wherein said at least one electronic component comprises a tape deck and a tuner.

* * * * *